(12) United States Patent
Hsu

(10) Patent No.: US 12,144,166 B2
(45) Date of Patent: Nov. 12, 2024

(54) SEMICONDUCTOR STRUCTURE AND METHOD OF MANUFACTURING THE SAME

(71) Applicant: CHANGXIN MEMORY TECHNOLOGIES, INC., Hefei (CN)

(72) Inventor: Cheng-Hung Hsu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 488 days.

(21) Appl. No.: 17/445,085

(22) Filed: Aug. 14, 2021

(65) Prior Publication Data

US 2021/0375879 A1 Dec. 2, 2021

Related U.S. Application Data

(63) Continuation of application No. PCT/CN2021/094286, filed on May 18, 2021.

(30) Foreign Application Priority Data

May 22, 2020 (CN) .......................... 202010441445.9

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC ............................. H10B 12/34; H10B 12/053
USPC ........................................................ 257/296
See application file for complete search history.

(56) References Cited

U.S. PATENT DOCUMENTS

| | | | |
|---|---|---|---|
| 7,119,384 | B2 | 10/2006 | Popp |
| 2006/0046407 | A1 | 3/2006 | Juengling |
| 2008/0003753 | A1 | 1/2008 | Seo |
| 2008/0105916 | A1 | 5/2008 | Watanabe |

(Continued)

FOREIGN PATENT DOCUMENTS

| | | |
|---|---|---|
| CN | 101257025 A | 9/2008 |
| CN | 108717947 A | 10/2018 |

(Continued)

OTHER PUBLICATIONS

International Search Report in the international application No. PCT/CN2021/094286, mailed on Aug. 23, 2021.

(Continued)

*Primary Examiner* — Dzung Tran
(74) *Attorney, Agent, or Firm* — Syncoda LLC; Feng Ma

(57) ABSTRACT

A method for manufacturing a semiconductor structure includes: a substrate is provided, and Shallow Trench Isolation (STI) structures are formed in the substrate, the STI structures isolating a plurality of Active Areas (AAs) spaced in the substrate; word line trenches are formed in the substrate; an etch protection layer is formed on a surface of the first protruding structure; the STI structure is partially removed to form a second protruding structure based on the first protruding structure; the lower portion of the second protruding structure is etched to make a width of the lower portion of the second protruding structure smaller than a width of an upper portion of the second protruding structure; and a word line structure is formed in the word line trench.

18 Claims, 26 Drawing Sheets

(56) References Cited

U.S. PATENT DOCUMENTS

| | | | |
|---|---|---|---|
| 2010/0096693 A1* | 4/2010 | Hong | H10B 12/482 |
| | | | 438/589 |
| 2010/0171160 A1* | 7/2010 | Katsuki | H10B 12/0335 |
| | | | 257/306 |
| 2012/0299088 A1* | 11/2012 | Heineck | H10B 12/20 |
| | | | 257/E21.135 |
| 2013/0187220 A1 | 7/2013 | Surthi | |
| 2013/0187279 A1* | 7/2013 | Surthi | H01L 21/76897 |
| | | | 257/E23.06 |
| 2014/0027916 A1* | 1/2014 | Lee | H10B 12/485 |
| | | | 257/773 |
| 2014/0070306 A1 | 3/2014 | Surthi | |
| 2015/0145013 A1 | 5/2015 | Won | |
| 2015/0255599 A1 | 9/2015 | Surthi | |
| 2016/0086888 A1 | 3/2016 | Won | |
| 2017/0040327 A1 | 2/2017 | Nobuto | |
| 2017/0317086 A1 | 11/2017 | Nobuto | |

FOREIGN PATENT DOCUMENTS

| | | |
|---|---|---|
| CN | 109979939 A | 7/2019 |
| CN | 210575894 U | 5/2020 |

OTHER PUBLICATIONS

Hynix DRAM layout, process integration adapt to change, Arabinda Das, UBM TechInsights—Dec. 18, 2012.

Impact of Varying Fin Width in an n-FinFET at 20nm Gate Length, International Journal of Computer Applications (0975-8887)vol. 122—No. 6, Jul. 2015, Kanika Mishra, Ravinder Singh Sawhney, Electronics Technology Department Guru Nanak Dev University, Amritsar.

Supplementary European Search Report in the European application No. 21800975.1, mailed on Jul. 22, 2022.

* cited by examiner

SEMICONDUCTOR STRUCTURE AND METHOD OF MANUFACTURING THE SAME

CROSS-REFERENCE TO RELATED APPLICATIONS

This is a continuation of International Patent Application No. PCT/CN2021/094286 filed on May 18, 2021, which claims priority to Chinese Patent Application No. 202010441445.9 filed on May 22, 2020. The disclosures of these applications are hereby incorporated by reference in their entirety.

BACKGROUND

Shallow Trench Isolation (STI) structures isolate a plurality of spaced Active Areas (AAs) in a substrate. A word line structure of a gate of a transistor that can be used as a storage unit is intersected with the AA, and a source and drain of the transistor are formed in the substrate on two sides of the gate. In a conventional semiconductor process, a word line trench of a word line structure is formed by once etching, and there is no obvious difference between a width of an upper portion and a width of a lower portion of a conducting layer in the word line structure.

SUMMARY

The present disclosure relates generally to the technical field of integrated circuits, and more specifically a semiconductor structure and a method for manufacturing the same.

According to some embodiment, a semiconductor structure and a method for manufacturing the same are provided.

A method for manufacturing a semiconductor structure may include the following operations.

A substrate is provided, and STI structures are formed in the substrate, the STI structures isolating a plurality of AAs spaced in the substrate.

Word line trenches are formed in the substrate, a depth of a portion of the word line trench in the AA being smaller than a depth of the portion in the STI structure, such that a first protruding structure is formed at a bottom portion of the word line trench in AAs.

An etch protection layer is formed on a surface of the first protruding structure.

The STI structure is partially removed to form a second protruding structure based on the first protruding structure, an upper-portion sidewall and top of the second protruding structure being covered with the etch protection layer, and a lower portion of the second protruding structure being exposed from a removed portion of the STI structure.

The lower portion of the second protruding structure is etched to make a width of the lower portion of the second protruding structure smaller than a width of an upper portion of the second protruding structure.

A word line structure is formed in the word line trench.

BRIEF DESCRIPTION OF THE DRAWINGS

In order to describe the technical solutions in the embodiments of the application or a conventional art more clearly, the drawings required to be used in descriptions about the embodiments or the conventional art will be simply introduced below. It is apparent that the drawings described below are only some embodiments of the application. Other drawings may further be obtained by those of ordinary skill in the art according to these drawings without creative work.

DETAILED DESCRIPTION

Figure 1:
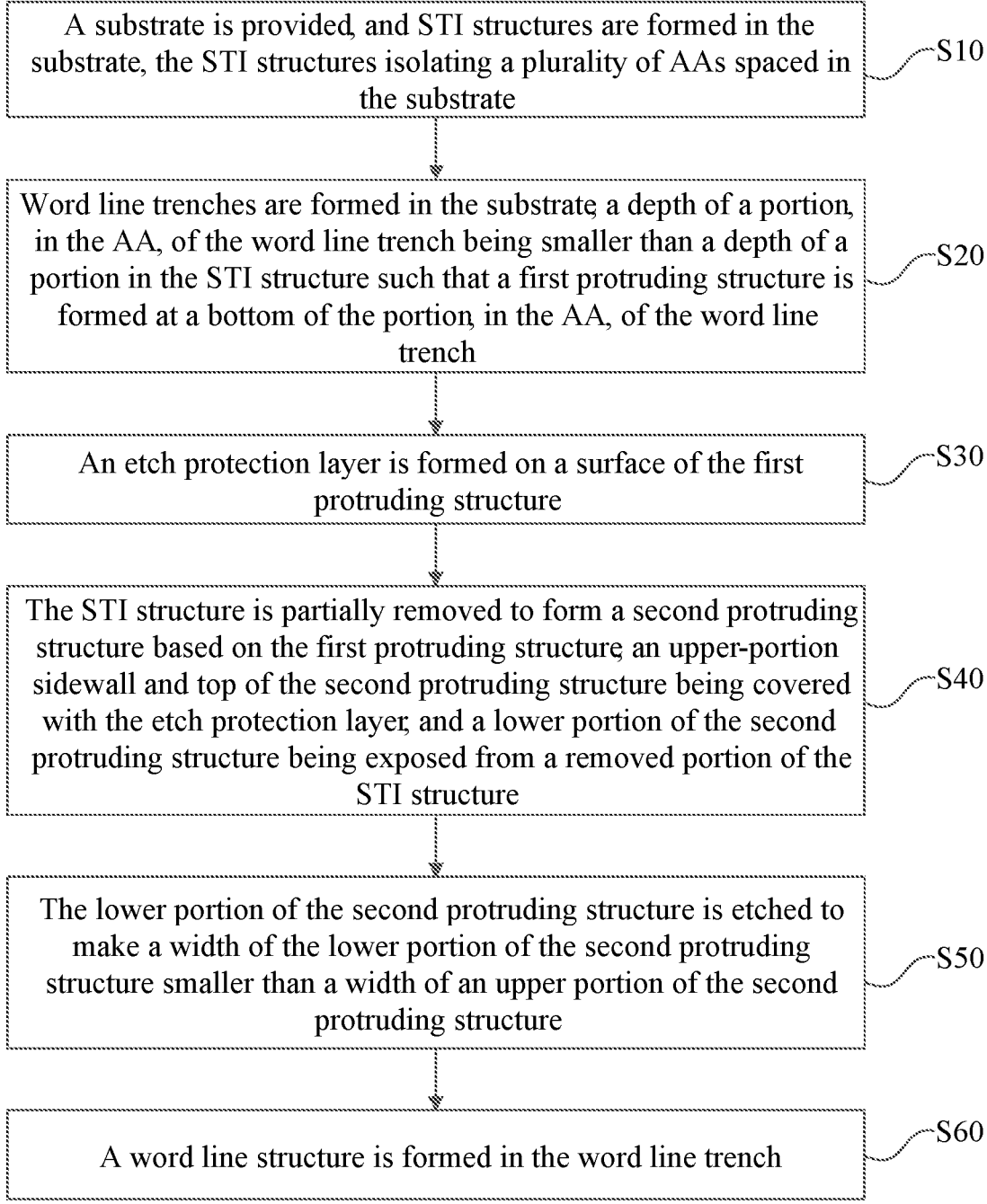
FIG. 1 is a flowchart of a method for manufacturing a semiconductor structure according to an embodiment.

For making the application convenient to understand, the application will be described more comprehensively below with reference to the related drawings. The drawings show preferred embodiments of the application. However, the application may be implemented in various forms and is not limited to the embodiments described herein. Instead, these embodiments are provided to make the contents disclosed in the application understood more thoroughly and comprehensively.

Unless otherwise defined, all technical and scientific terms used herein have the same meanings as commonly understood by those skilled in the art of the application. In the disclosure, terms used in the description of the application are only for a purpose of describing specific embodiments and not intended to limit the application. Term "and/or" used herein includes one or any and all combinations of multiple related items which are listed.

In the descriptions of the application, it is to be understood that orientation or position relationships indicated by terms "top", "bottom", "vertical", "horizontal", "inner", "outer", and the like are orientation or position relationships shown in the drawings, are adopted not to indicate or imply that indicated devices or components must be in specific orientations or structured and operated in specific orientations but only to conveniently describe the application and simplify descriptions, and thus should not be understood as limits to the application.

A channel width of a gate in a semiconductor device with the abovementioned word line structure is relatively small, resistance between a source and a drain is relatively high, and thus a current between the source and the drain during work is relatively low, affecting the performance of the device. To increase the channel width of the gate to a required width, an overall width of an AA is required to be increased, and increase of the width of the AA may make a distance between AAs too small and further short-circuit adjacent AAs.

Referring to FIG. 1, various embodiments the present application provide a method for manufacturing a semiconductor structure. The method for manufacturing a semiconductor structure may include the following operations.

In S10, a substrate 10 is provided, and STI structures 20 are formed in the substrate 10, the STI structures 20 isolating a plurality of AAs 40 spaced in the substrate 10.

In S20, word line trenches 30 are formed in the substrate 10, a depth of a portion of the word line trench 30 in the AA 40 being smaller than a depth of a portion of the word line trench 30 in the STI structure 20, such that a first protruding structure 310 is formed at a bottom of the portion of the word line trench 30 in the AA 40.

In S30, an etch protection layer 330 is formed on a surface of the first protruding structure 310.

In S40, the STI structure 20 is partially removed to form a second protruding structure 340 based on the first protruding structure 310, an upper-portion sidewall and top of the second protruding structure 340 being covered with the etch protection layer 330, and a lower portion of the second protruding structure 340 being exposed from a removed portion of the STI structure.

In S50, the lower portion of the second protruding structure 340 is etched to make a width of the lower portion of the second protruding structure 340 smaller than a width of an upper portion of the second protruding structure 340.

In S60, a word line structure 50 is formed in the word line trench 30.

The second protruding structure 340 is formed at the bottom portion of the word line trench 30 in the AA40 of a semiconductor structure 100 manufactured by the method for manufacturing a semiconductor structure, and the width of the lower portion of the second protruding structure 340 is smaller than the width of the upper portion of the second protruding structure 340, so that a channel width of a gate can be increased on the premise of not increasing a width of an upper portion of the AA 40, resistance between a source and a drain can be reduced, and a current between the source and the drain can be increased.

In one of the embodiments, the substrate 10 provided in S10 may include any existing semiconductor substrate. In the embodiment, the substrate 10 may include, but not limited to, a silicon substrate.

In one of the embodiments, the operation in S10 that the STI structures 20 are formed in the substrate 10 may include the following operations.

In S110, a first mask layer 210 is formed on an upper surface of the substrate 10.

In S120, the first mask layer 210 is patterned to obtain a first patterned mask layer 220, a plurality of first opening patterns 221 being formed in the first patterned mask layer 220, and the plurality of first opening patterns 221 defining positions of the STI structures 20.

In S130, the substrate 10 is etched based on the first patterned mask layer 220 to form a plurality of shallow trenches 230 in the substrate 10.

In S140, the shallow trenches 230 are filled with an isolation material 240 to form the STI structures 20.

Figure 2:
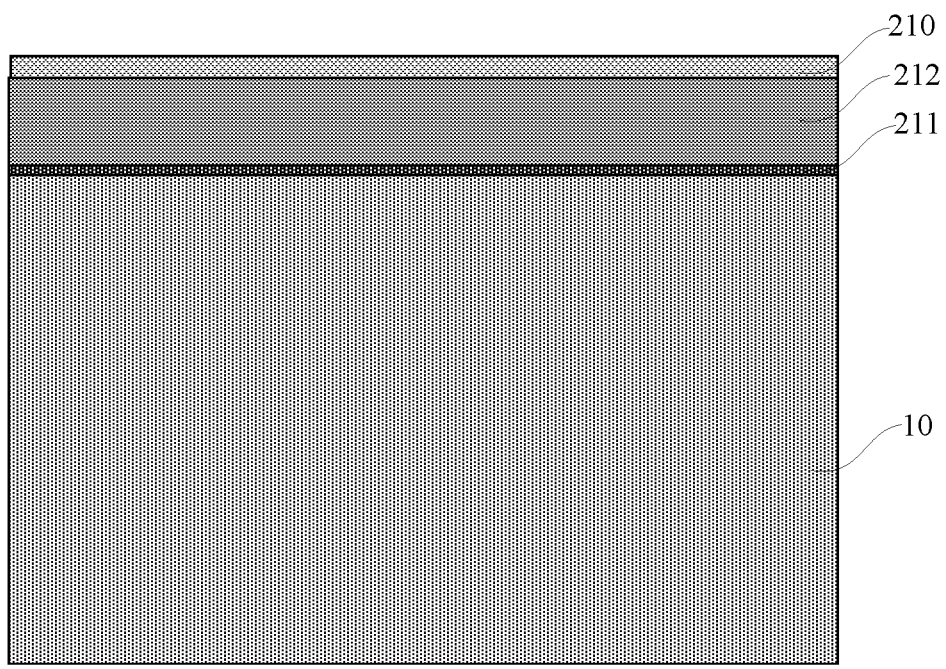
FIG. 2 is a sectional structure diagram of a substrate with an oxide layer, a nitride layer, and a first mask layer formed on an upper surface in a method for manufacturing a semiconductor structure according to an embodiment.

Referring to FIG. 2 together, in one of the embodiments, before S110, the following operations can be included: an oxide layer 211 is formed on the upper surface of the substrate 10, and a nitride layer 212 is formed on an upper surface of the oxide layer 211.

In one of the embodiments, in S110, the first mask layer 210 can be a photoresist layer, and the first mask layer 210 can be formed on the upper surface of the nitride layer 212 using, but not limited to, a spin-on process.

In one of the embodiments, the oxide layer 211 can be formed using a physical vapor deposition process, a chemical deposition process, a thermal oxidation process, etc. When the substrate 10 is a silicon substrate, the oxide layer 211 can be formed on the surface of the substrate 10 using the thermal oxidation process. A thickness of the oxide layer 211 can be set according to actual needs. In the embodiment, the thickness of the oxide layer 211 can be, but not limited to, 3 nm to 15 nm.

In one of the embodiments, the nitride layer 212 can be formed using the physical vapor deposition process, a Chemical Vapor Deposition (CVD) process, etc. In the embodiment, the nitride layer 212 can be formed using a Low-Pressure CVD (LPCVD) process. The nitride layer 212 may include, but not limited to, silicon oxide. A thickness of the nitride layer 212 can be set according to actual needs. In the embodiment, the thickness of the nitride layer 212 can be, but not limited to, 100 nm to 200 nm.

Figure 3:
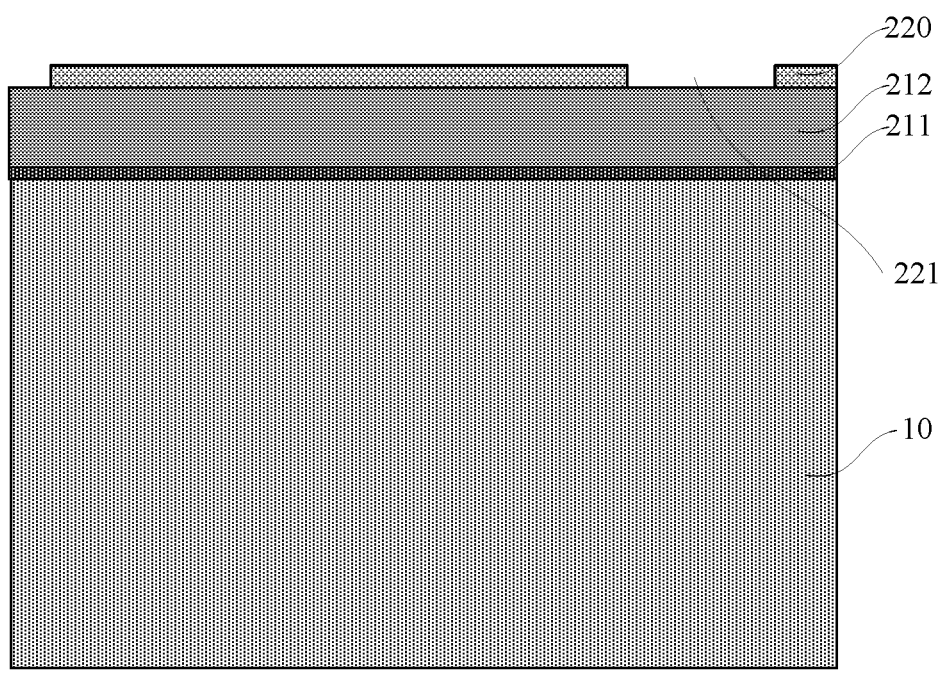
FIG. 3 is a sectional structure diagram of a structure obtained after a first mask layer is patterned in a method for manufacturing a semiconductor structure according to an embodiment.

Referring to FIG. 3 together, in one of the embodiments, the first mask layer 210 can be patterned in S120 using a photoetching process to obtain the first patterned mask layer 220. The plurality of first opening patterns 221 is formed in the first mask layer 220, and the plurality of first opening patterns 221 defines the positions of the shallow trench 230.

Figure 4:
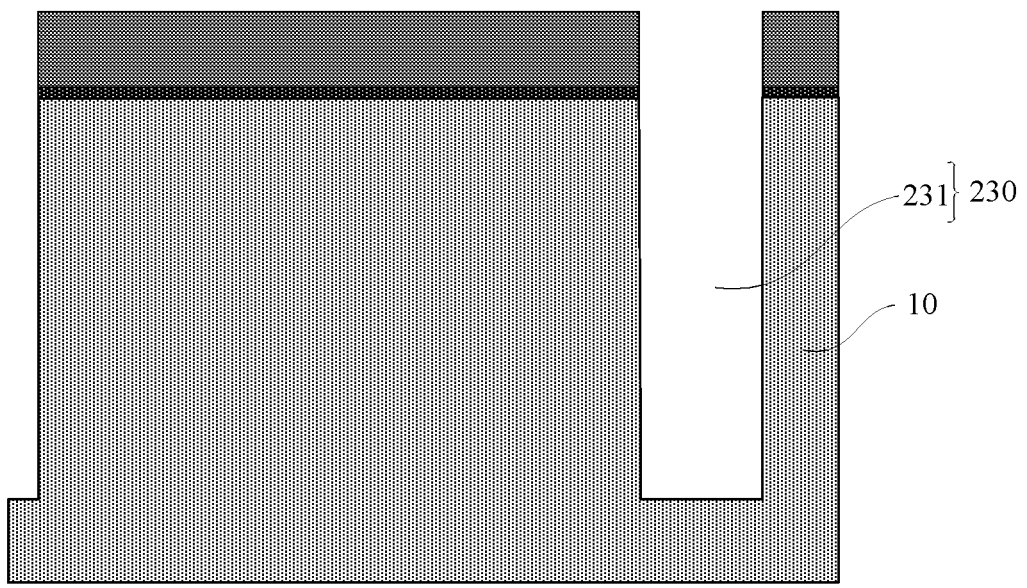
FIG. 4 is a sectional structure diagram of a structure obtained after a shallow trench is formed in a substrate in a method for manufacturing a semiconductor structure according to an embodiment.

Referring to FIG. 4 together, in one of the embodiments, the oxide layer 211, the nitride layer 212, and the substrate 10 can be simultaneously etched in S130 based on the first patterned mask layer 220, the substrate 10 being etched using, but not limited to, a dry etching process, to form the shallow trench 230 in the substrate 10. In the embodiment, the shallow trench 230 may include a first shallow trench 231 and a second shallow trench (not shown). The first shallow trench 231 can be in the substrate 10 between two adjacent AAs 40 in a length direction of the AA 40 (an extending direction of the AA 40), and the second shallow trench can be in the substrate 10 between two adjacent AAs 40 in a width direction of the AA 40 (perpendicular to the extending direction of the AA 40). In one of the embodiments, after S130, an operation of removing the first patterned mask layer 220 can be included. In the embodiment, a distance from the first shallow trench 231 to the upper surface of the substrate 10 can be 250 nm to 350 nm, and a distance from the second shallow trench to the upper surface of the substrate 10 can be 200 nm to 300 nm.

Figure 5:
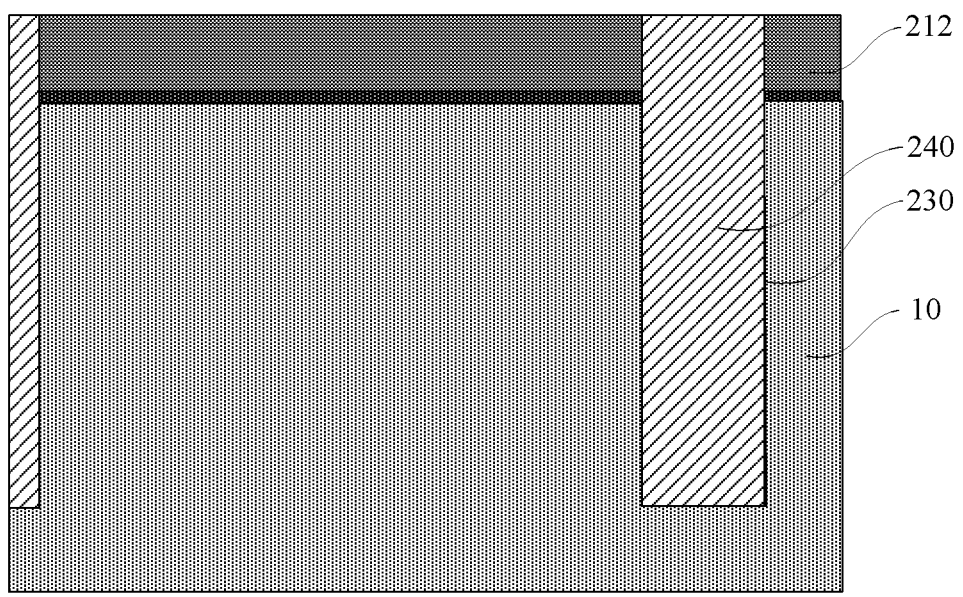
FIG. 5 is a sectional structure diagram of a structure obtained after an STI structure is formed in a substrate in a method for manufacturing a semiconductor structure according to an embodiment.

Referring to FIG. 5 together, the operation in S140 that the shallow trench 230 is filled with the isolation material 240 to form the STI structure 20 may include the following operations.

In S141, the isolation material 240 are filled in the shallow trenches 230 and on the upper surface of the etched nitride layer 212.

In S142, the isolation material 240 on the upper surface of the etched nitride layer 212 is removed, and the shallow trenches 230 are filled with the remaining isolation material 240, an upper surface of the remaining isolation material 240 being flush with the upper surface of the patterned nitride layer 212.

In one of the embodiments, the isolation material 240 can be formed using, but not limited to, a High-Density Plasma-CVD (HDPCVD) process, a Flowable oxide CVD process, or a Spin-on Dielectric (SOD) process. The isolation material 240 may include, but not limited to, silicon oxide.

In one of the embodiments, the isolation material 240 on the upper surface of the etched nitride layer 212 can be removed using, but not limited to, a Chemical Mechanical Polishing (CMP) process. The patterned nitride layer 212 can be used as a grinding stopping layer.

In one of the embodiments, the operation in S20 that the word line trench 30 is formed in the substrate 10 may include the following operations.

In S210, a second mask layer (not shown) is formed on the upper surface of the substrate 10.

In S220, the second mask layer is patterned to obtain a second patterned mask layer 321, a second open pattern 322 being formed in the second patterned mask layer 321, and the second open pattern 322 defining a position of the word line trench 30.

In S230, the substrate 10 is etched based on the second patterned mask layer 321 to form the word line trench 30 in the substrate 10.

Figure 6:
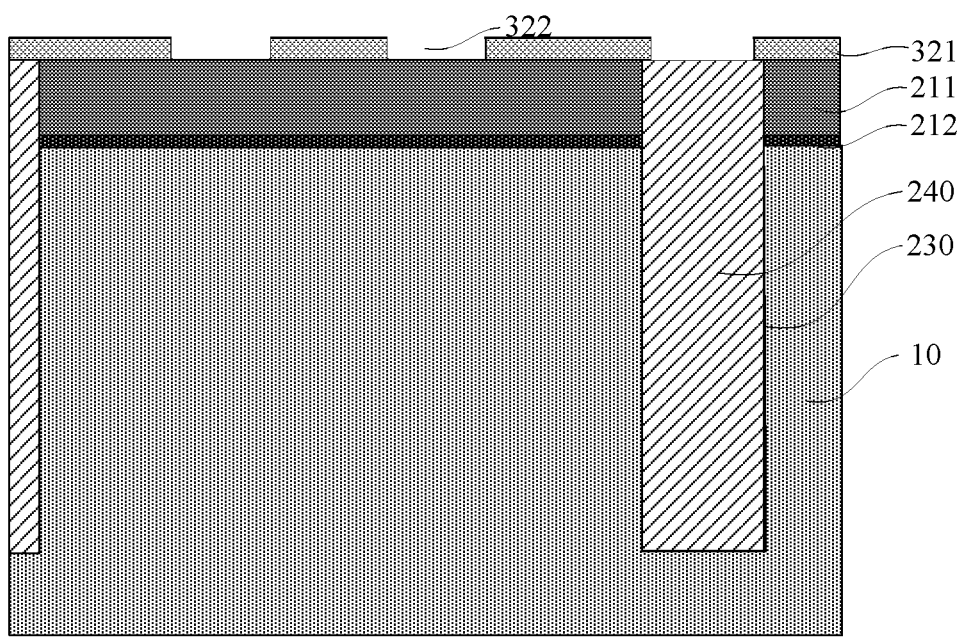
FIG. 6 is a sectional structure diagram of a structure obtained after a second mask layer is patterned in a method for manufacturing a semiconductor structure according to an embodiment.

Referring to FIG. 6 together, in one of the embodiments, the second mask layer can be patterned in S210 using the photoetching process to obtain the second patterned mask layer 321. The second open pattern 322 is formed in the second patterned mask layer 321, and the second open pattern 322 defines the position of the word line trench 30.

Figure 7:
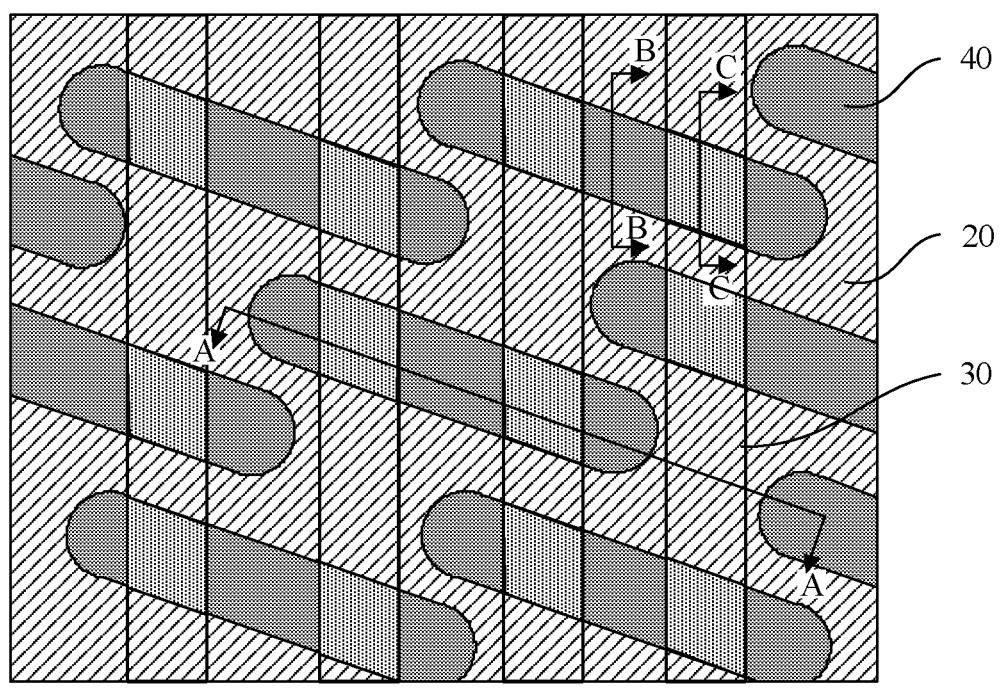
FIG. 7 is a schematic diagram of a structure obtained after a word line trench is formed in a substrate in a method for manufacturing a semiconductor structure according to an embodiment.
Figure 8:
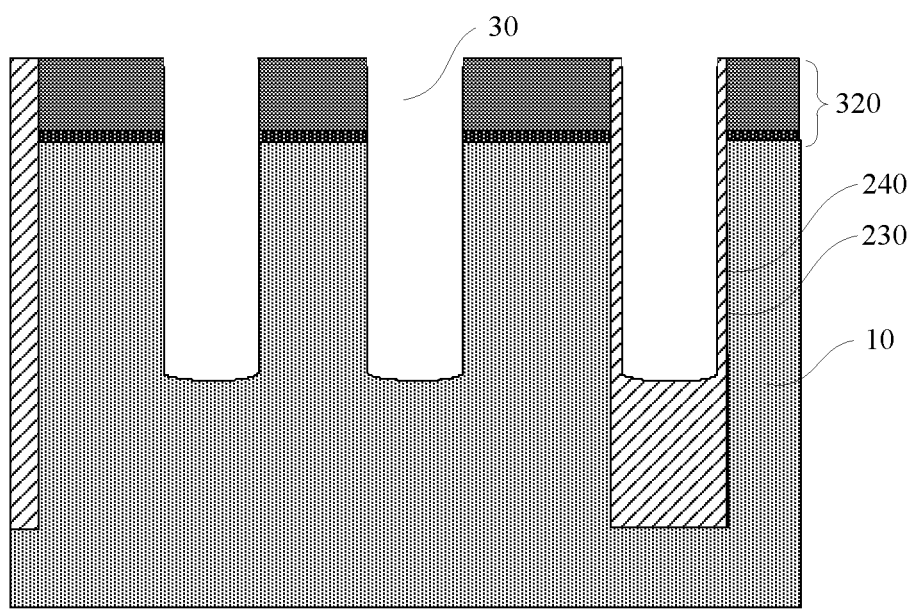
FIG. 8 is a sectional structure diagram along direction AA in FIG. 7.

Referring to FIG. 7 to FIG. 8 together, in one of the embodiments, the substrate 10, the oxide layer 211, and the nitride layer 212 can be etched in S220 using, but not limited to, the dry etching process based on the second patterned mask layer 321 to form the word line trench 30 in the substrate 10. After S220, an operation of removing the second patterned mask layer 321 can be included. In one of the embodiments, an intersection angle of an extending direction of the word line trench 30 and the extending direction of the AA 40 can be smaller than 90 degrees.

Figure 9:
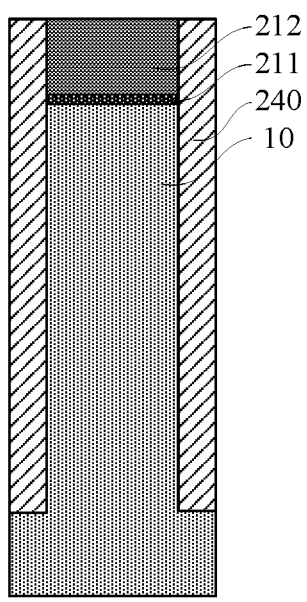
FIG. 9 is a sectional structure diagram along direction BB in FIG. 7.
Figure 10:
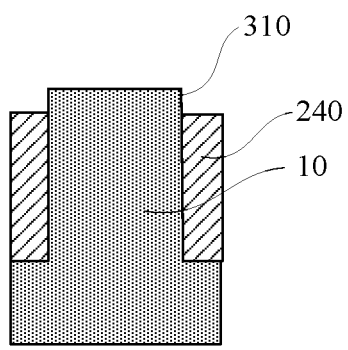
FIG. 10 is a sectional structure diagram along direction CC in FIG. 7.

Referring to FIG. 9 to FIG. 10 together, in one of the embodiments, in a process of forming the word line trench 30, along the extending direction of the word line trench 30, the depth of the portion, in the AA 40, of the word line trench 30 is different from the depth of the word line trench 30 in the STI structure 20, and the depth of the portion, in the AA 40, of the word line trench 30 is usually smaller than the depth of the word line trench in the STI structure 20 such that the first protruding structure 310 is formed at the bottom of the portion, in the AA 40, of the word line trench 30. In the embodiment, wet cleaning and wet etching can be performed on the isolation material 240 in the word line trench 30 using, but not limited to, Hydrogen Fluoride (HF), Diluted HF (DHF) (1:100 to 1:2,000, namely 49% HF: deionized water), Buffered Oxide Etch (BOE), etc., to form the first protruding structure 310. A depth of each portion of the word line trench 30 can be set as practically required. In the embodiment, the depth of the portion, in the AA 40, of the word line trench 30 can be, but not limited to, 90 nm to 160 nm, and the depth of the portion in the STI structure 20 is 100 nm to 180 nm.

Figure 11:
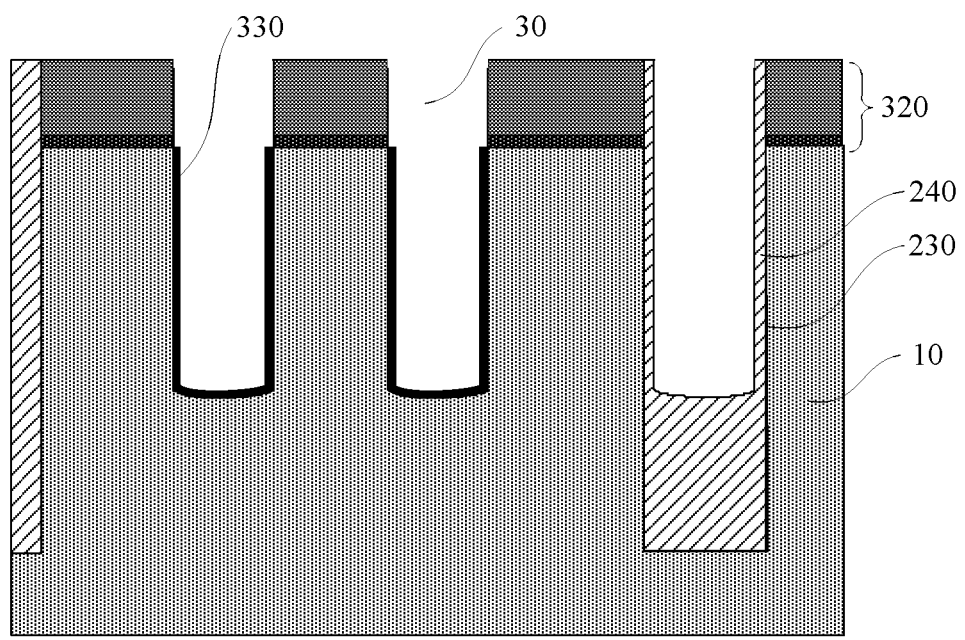
FIG. 11 is a sectional structure diagram of a structure obtained after an etch protection layer is formed along direction AA in FIG. 7 in a substrate in a method for manufacturing a semiconductor structure according to an embodiment.
Figure 12:
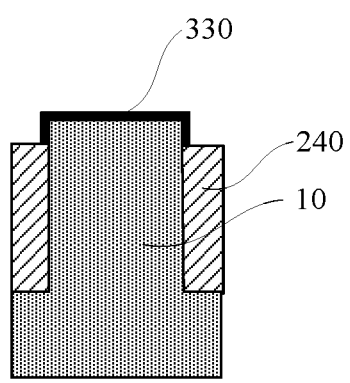
FIG. 12 is a sectional structure diagram of a structure obtained after an etch protection layer is formed along direction CC in FIG. 7 in a substrate a method for manufacturing a semiconductor structure according to an embodiment.

Referring to FIG. 11 to FIG. 12 together, in one of the embodiments, the operation in S30 that the etch protection layer 330 is formed on the surface of the first protruding structure 310 may include the following operation.

In S310, nitrogen is introduced to the word line trench 30 at a preset temperature to form the nitride layer on a sidewall and bottom of the portion, in the AA 40, of the word line trench 30 as the etch protection layer 330.

In one of the embodiments, when the substrate 10 is a silicon substrate, nitrogen can be introduced to the word line trench 30 at a high temperature over 900° C., partial pressure of the nitrogen being about 0.1 MPa, to form a silicon nitride layer on an exposed sidewall and bottom of the silicon substrate as the etch protection layer 330 to protect the silicon substrate. A reaction formula can be represented as:

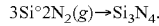

Figure 13:
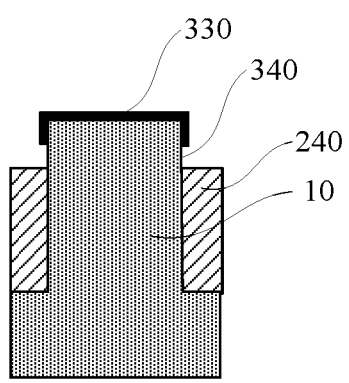
FIG. 13 is a sectional structure diagram of a structure obtained after a second protruding structure is formed based on a first protruding structure in a method for manufacturing a semiconductor structure according to an embodiment.

Referring to FIG. 13 together, in one of the embodiments, the isolation material 240 can be etched in S40 using, but not limited to, wet cleaning and wet etching processes. In the embodiment, wet cleaning and wet etching can be performed on the isolation material 230 using, but not limited to, HF, DHF (1:100 to 1:2,000, namely 49% HF:deionized water), BOE, etc., to increase a height difference between the upper surface of the word line trench 30 in the AA 40 and the upper surface in the STI structure 20, namely forming the second protruding structure 340 based on the first protruding structure 310. It is to be noted that, after S40 is completed, the upper-portion sidewall and top of the second protruding structure 340 are covered with the etch protection layer 330, and the lower portion of the second protruding structure 340 is exposed from a removed portion of the isolation material 240.

In one of the embodiments, a height of the lower portion of the second protruding structure 340 can be set as practically required. In the embodiment, the height of the lower portion of the second protruding structure 340 can be, but not limited to, 3 to 20 nm. The width of the lower portion of the second protruding structure 340 can be smaller than the width of the upper portion by, but not limited to, 2 to 10 nm.

Figure 14:
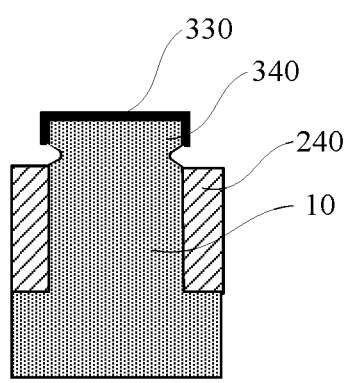
FIG. 14 is a sectional structure diagram of a structure obtained after a lower portion of a second protruding structure is etched based on an etch protection layer in a method for manufacturing a semiconductor structure according to an embodiment.

Referring to FIG. 14 together, in one of the embodiments, an exposed portion of the lower portion of the second protruding structure 340 can be etched in S50 using, but not limited to, wet etching to make the width of the lower portion of the second protruding structure 340 smaller than the width of the upper portion of the second protruding structure 340. When the substrate 10 is a silicon substrate, the silicon substrate can be etched using, but not limited to, alkaline liquid such as diluted KOH or $NH_4OH$ to increase a channel width of the gate, reduce the resistance between the source and the drain, and increase the current between the source and the drain. Reaction formulas can be represented as:

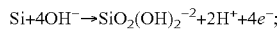

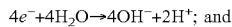

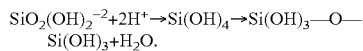

In one of the embodiments, the operation in S60 that the word line structure 50 is formed in the word line trench 30 may include the following operations.

In S610, a gate dielectric layer 510 is formed on the sidewall of the word line trench 30, the bottom of the word line trench 30, the upper surface of the etched nitride layer 212, and the upper surface of the STI structure 20.

In S620, a first conducting material layer 520 is formed on a surface of the gate dielectric layer 510.

In S630, a second conducting material layer 530 is formed on a surface of the first conducting material layer 520.

In S640, the first conducting material layer 520 and second conducting material layer 530 on the upper surface of the etched nitride layer 212 and the upper surface of the STI structure 20 are removed, and etching-back is performed to partially remove the first conducting material layer 520 and second conducting material layer 530 in the word line trench 30 to obtain a first conducting layer 540 and a second conducting layer 550, both an upper layer of the first conducting layer 540 and an upper surface of the second conducting layer 550 being lower than a top of the word line trench 30.

In one of the embodiments, before S610, the oxide layer naturally formed on the surface where the gate dielectric layer 510 is to be formed can be removed using, but not limited to, wet etching. In the embodiment, wet cleaning can be performed using, but not limited to, HF, DHF (1:100 to 1:2,000, namely 49% HF: deionized water), BOE, etc., to remove the oxide layer naturally formed on the sidewall of the word line trench 30, the bottom of the word line trench 30, the upper surface of the etched nitride layer 212, and the upper surface of the STI structure 20.

Figure 15:
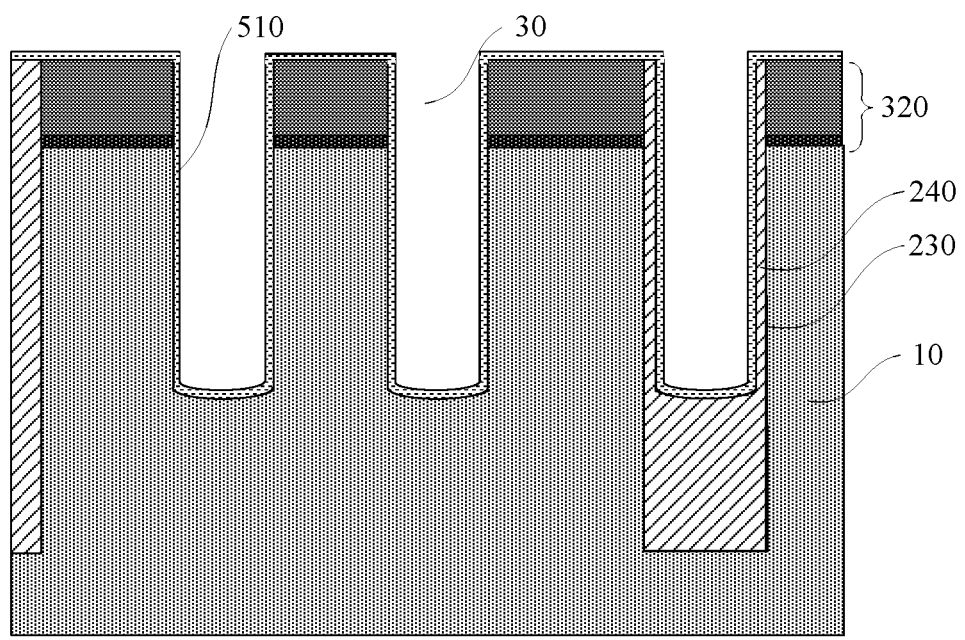
FIG. 15 is a sectional structure diagram of a structure obtained after a gate dielectric layer is formed along direction AA in FIG. 7 in a substrate in a method for manufacturing a semiconductor structure according to an embodiment.
Figure 16:
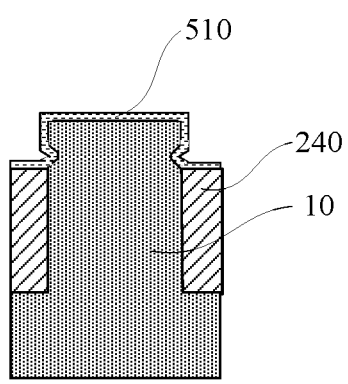
FIG. 16 is a sectional structure diagram of a structure obtained after a gate dielectric layer is formed along direction CC in FIG. 7 in a substrate in a method for manufacturing a semiconductor structure according to an embodiment.

Referring to FIG. 15 to FIG. 16 together, in one of the embodiments, the gate dielectric layer 510 in S610 may include a silicon oxide layer, a silicon nitride layer, or a high-k dielectric layer. In the embodiment, the high-k dielectric layer can be, but not limited to, an alumina layer, a hafnium oxide layer, a hafnium silicon oxide layer, a hafnium alumina layer, a tantalum oxide layer, a zirconia layer, or a stack of the multiple layers. A thickness of the gate dielectric layer 510 can be, but not limited to, 3 nm to 7 nm.

Figure 17:
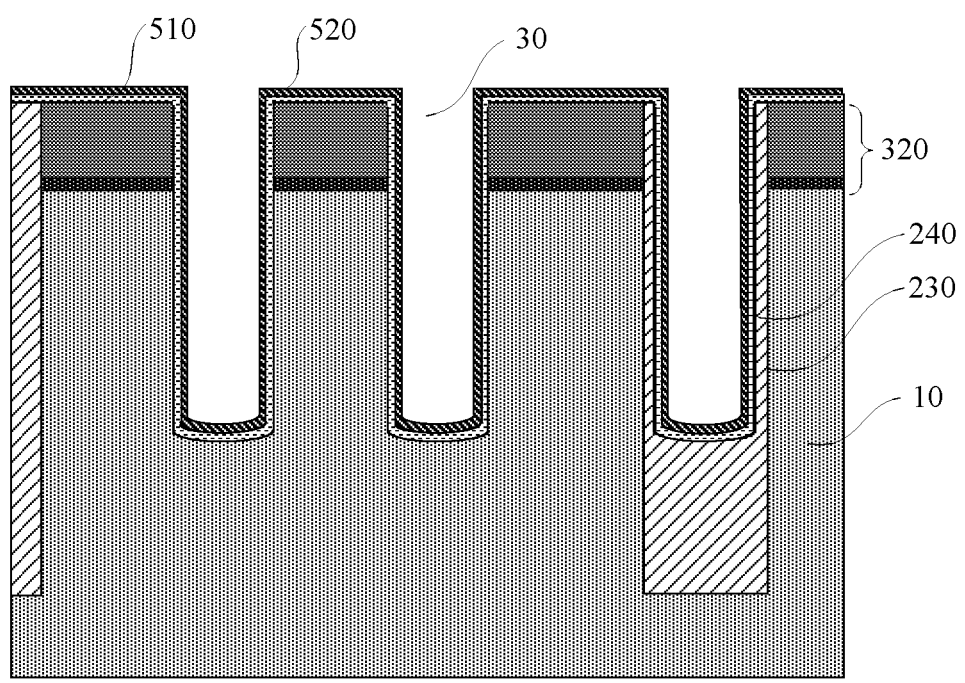
FIG. 17 is a sectional structure diagram of a structure obtained after a first conducting material layer is formed along direction AA in FIG. 7 in a substrate in a method for manufacturing a semiconductor structure according to an embodiment.
Figure 18:
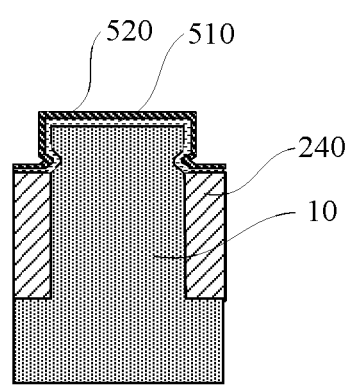
FIG. 18 is a sectional structure diagram of a structure obtained after a first conducting material layer is formed along direction CC in FIG. 7 in a substrate in a method for manufacturing a semiconductor structure according to an embodiment.

Referring to FIG. 17 to FIG. 18 together, in one of the embodiments, the first conducting material layer 520 can be formed in S620 using, but not limited to, the physical vapor deposition process, the CVD process, etc. The first conducting material layer 520 may include, but not limited to, a titanium nitride layer. A thickness of the first conducting material layer 520 can be, but not limited to, 2 nm to 5 nm.

Figure 19:
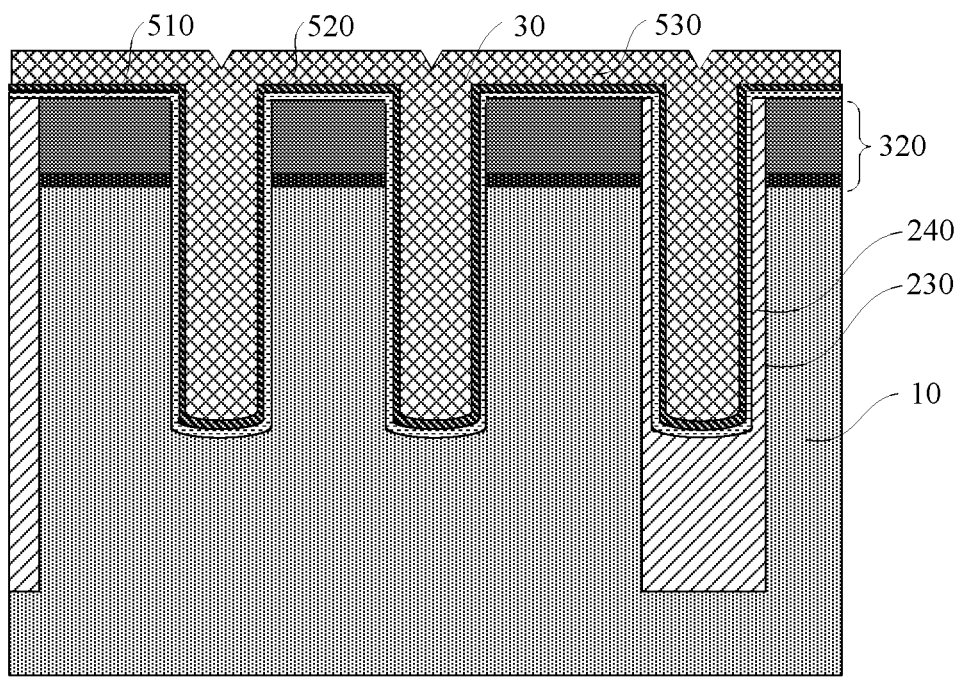
FIG. 19 is a sectional structure diagram of a structure obtained after a second conducting material layer is formed along direction AA in FIG. 7 in a substrate in a method for manufacturing a semiconductor structure according to an embodiment.
Figure 20:
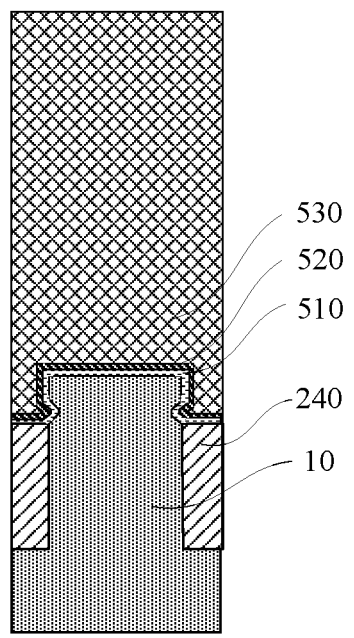
FIG. 20 is a sectional structure diagram of a structure obtained after a second conducting material layer is formed along direction CC in FIG. 7 in a substrate in a method for manufacturing a semiconductor structure according to an embodiment.

Referring to FIG. 19 to FIG. 20 together, in one of the embodiments, the second conducting material layer 530 can be formed in S630 using an electroplating process, etc. The second conducting material layer 530 may include, but not limited to, a tungsten layer.

Figure 21:
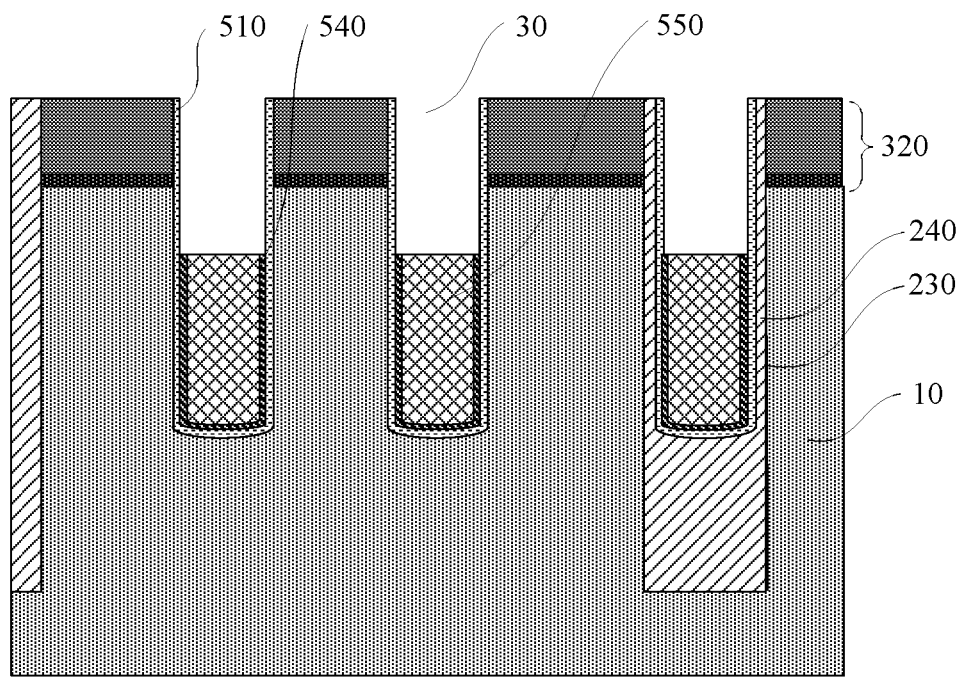
FIG. 21 is a sectional structure diagram of a structure obtained after a first conducting layer and a second conducting layer are formed along direction AA in FIG. 7 in a substrate in a method for manufacturing a semiconductor structure according to an embodiment.
Figure 22:
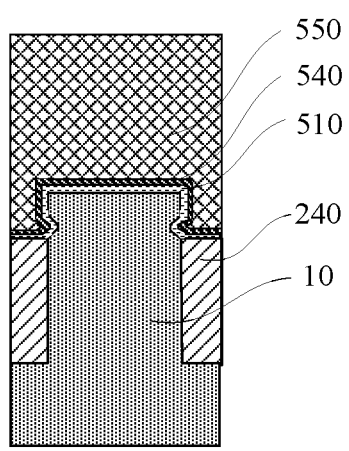
FIG. 22 is a sectional structure diagram of a structure obtained after a first conducting layer and a second conducting layer are formed along direction CC in FIG. 7 in a substrate in a method for manufacturing a semiconductor structure according to an embodiment.

Referring to FIG. 21 to FIG. 22 together, in one of the embodiments, the first conducting material layer 520 and second conducting material layer 530 on the upper surface of the patterned nitride layer 212 can be removed in S640 using a CMP process. After etching-back, both the upper surface of the first conducting layer 540 and the upper surface of the second conducting layer 550 are lower than the top of the word line trench 30, and the upper surface of the second conducting layer 550 is higher than the upper surface of the first conducting layer 540.

Figure 23:
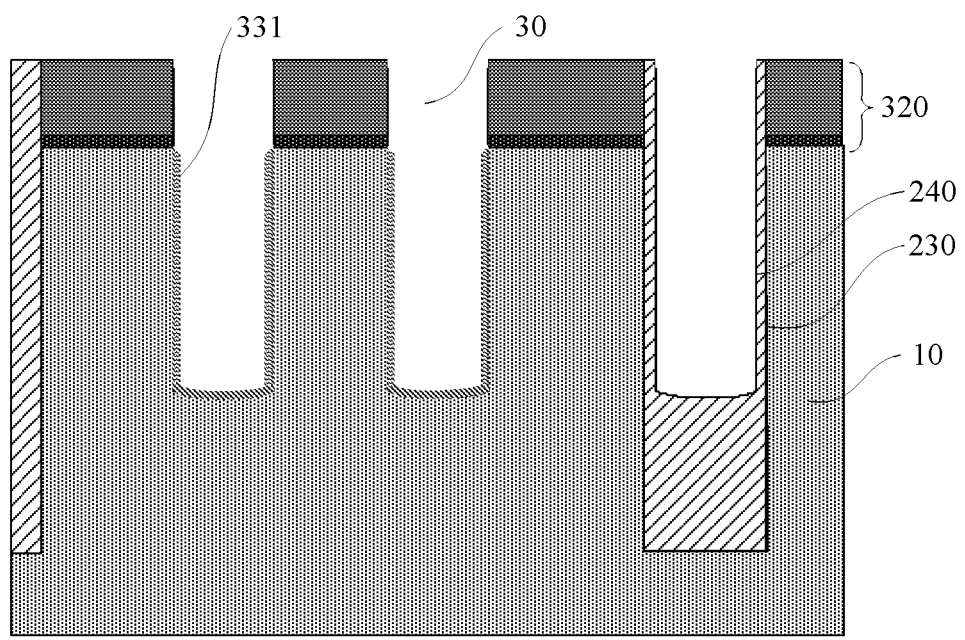
FIG. 23 is a sectional structure diagram of a structure obtained after an etch protection layer is formed along direction AA in FIG. 7 in a substrate in another method for manufacturing a semiconductor structure according to an embodiment.
Figure 24:
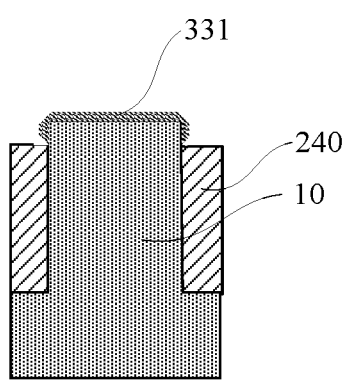
FIG. 24 is a sectional structure diagram of a structure obtained after an etch protection layer is formed along direction CC in FIG. 7 in a substrate in another method for manufacturing a semiconductor structure according to an embodiment.

Referring to FIG. 23 to FIG. 24 together, in one of the embodiments, the operation that the etch protection layer 330 is formed on the surface of the first protruding structure 310 may include the following operation: an epitaxial layer 331 is formed on the sidewall and bottom of the portion, in the AA 40, of the word line trench 30 using an epitaxial growth method, a material of the epitaxial layer 331 being the same as a material of the substrate 10.

In one of the embodiments, the epitaxial layer 331 can be grown on the sidewall and bottom of the word line trench 30 using, but not limited to, a Vapor Phase Epitaxy (VPE) process, a Molecular Beam Epitaxy (MBE) process, and a Liquid Phase Epitaxy (LPE) process. When the substrate 10 is a silicon substrate, epitaxial silicon can be grown on the sidewall and bottom of the word line trench as the epitaxial layer 331 using the abovementioned processes to ensure that the material of the epitaxial layer 331 is the same as the material of the substrate 10.

In one of the embodiments, the operation that the word line structure 50 is formed in the word line trench 30 may include the following operations.

In S650, the gate dielectric layer 510 is formed on the sidewall and bottom of the word line trench 30.

In S660, the first conducting material layer 520 is formed on the surface of the gate dielectric layer 510.

In S670, the second conducting material layer 530 is formed on the surface of the first conducting material layer 520.

In S680, the first conducting material layer 520 and the second conducting material layer 530 are etched back to obtain the first conducting layer 540 and the second conducting layer 550, both the upper surface of the first conducting layer 540 and the upper surface of the second conducting layer 550 being lower than the top of the word line trench 30.

In one of the embodiments, before S650, the oxide layer naturally formed on the surface where the gate dielectric layer 510 is to be formed can be removed using, but not limited to, wet etching. In the embodiment, wet cleaning can be performed using, but not limited to, HF, DHF (1:100 to 1:2,000, namely 49% HF: deionized water), BOE, etc., to remove the oxide layer naturally formed on the sidewall of the word line trench 30, the bottom of the word line trench 30, the upper surface of the etched nitride layer 212, and the upper surface of the STI structure 20.

In one of the embodiments, the substrate can be oxidized in S650 using an In Situ Steam Generation (ISSG) process to form the gate dielectric layer 510. In the embodiment, the gate dielectric layer 510 can be a silicon oxide layer. The thickness of the gate dielectric layer 510 can be set as practically required. In the embodiment, the thickness of the gate dielectric layer 510 can be, but not limited to, 3 nm to 7 nm. It is to be noted that S660 to S680 can be the same as S620 to S640.

In one of the embodiments, the etch protection layer 330 may include an oxide layer or a nitride layer. In the embodiment, before the gate dielectric layer 510 is formed, an operation of removing the etch protection layer 330 may further be included.

In one of the embodiments, when the oxide layer and the nitride layer are formed on the sidewall and bottom of the word line trench 30 as the etch protection layer 330 in S330, before the word line structure 50 is formed in the word line trench 30 in S60, namely before the gate dielectric layer 510 is formed, the operation of removing the etch protection layer 330 is further included. In one of the embodiments, when the substrate 10 is a silicon substrate, and a silicon nitride is used as the etch protection layer, the silicon nitride can be removed using, but not limited to, wet etching. In the embodiment, the silicon nitride can be etched using a hot solution of $H_3PO_4$ at a temperature ranging from 110° C. to 165° C., and the silicon nitride can be removed by accurately controlling action time of the solution. It is to be noted that, in such case, a surface of the silicon nitride used as the nitride layer 212 is also etched slightly.

In one of the embodiments, after S680, the following operation is further included.

In S691, a filler insulating layer 570 is formed in the word line trench 30 and the upper surface of the etched nitride layer 212.

In one of the embodiments, the filler insulating layer 570 can be formed using, but not limited to, the LPCVD process. In the embodiment, the filler insulating layer 570 may include, but not limited to, a silicon nitride layer.

In one of the embodiments, after S691, the following operation is further included.

In S692, a drain (not shown) and a source (not shown) are formed in the AA 40, the drain being located between word lines 50 across the same AA 40, and the source being on the side of the word line 560 distal from the drain.

It is to be noted that, before the drain and the source are formed, the etched nitride layer 212, gate dielectric layer 510, first conducting material layer 520, and second conducting material layer 530 on the upper surface of the substrate 10 can be removed at first.

Based on the same inventive concept, the application also provides a semiconductor structure 100. The semiconductor structure 100 may include a substrate 10, STI structures 20, word line trenches 30 formed in the substrate 10, and word lines 560. The STI structures 20 isolate a plurality of spaced AAs 40 in the substrate 10. The word line trench 30 is in the substrate 10, a protruding structure 350 is formed at a bottom of a portion, in the AA 40, of the word line trench 30, and a width of a lower portion of the protruding portion 350 is smaller than a width of an upper portion of the protruding portion 350. The word line 560 is in the word line trench 30.

The protruding structure 350 is formed at the bottom portion of the word line trench 30 in the AA 40 of the semiconductor structure 100, and the width of the lower portion of the protruding structure 350 is smaller than the width of the upper portion of the protruding structure 350, so that a channel width of a gate can be increased on the premise of not increasing a width of an upper portion of the AA 40, resistance between a source and a drain can be reduced, and a current between the source and the drain can be increased.

In one of the embodiments, the substrate 10 may include any existing semiconductor substrate. In the embodiment, the substrate 10 may include, but not limited to, a silicon substrate.

In one of the embodiments, shallow trenches 230 are formed in the substrate 10, and the shallow trenches 230 can be filled with an isolation material 240 to form the STI structures 20. In the embodiment, the shallow trench 230 may include a first shallow trench 231 and a second shallow trench. The first shallow trench 231 can be in the substrate 10 between two adjacent AAs 40 in a length direction of the AA 40 (an extending direction of the AA 40), and the second shallow trench can be in the substrate 10 between two adjacent AAs 40 in a width direction of the AA 40 (perpendicular to the extending direction of the AA 40). In the embodiment, a distance from the first shallow trench 231 to an upper surface of the substrate 10 can be 250 nm to 350 nm, and a distance from the second shallow trench to the upper surface of the substrate 10 can be 200 nm to 300 nm.

In one of the embodiments, the word line trench 30 is formed in the substrate 10, and the word line 560 is in the word line trench 30, so a word line structure 50 is formed.

In one of the embodiments, an intersection angle of an extending direction of the word line trench 30 and the extending direction of the AA 40 can be smaller than 90 degrees.

In one of the embodiments, a distance between the bottom portion of the word line trench 30 in the AA 40 and the upper surface of the substrate 10 and a distance between a bottom portion of the word line trench 30 in the STI structure 20 and the upper surface of the substrate 10 can be set according to actual needs. In the embodiment, the distance between the bottom portion of the word line trench 30 in the AA 40 and the upper surface of the substrate 10 is, not limited to, 90 to 160 nm, and the distance between the bottom of the portion, in the STI structure 20, of the word line trench 30 and the upper surface of the substrate 10 is, but not limited to, 100 nm to 180 nm.

In one of the embodiments, a height of the lower portion of the protruding structure 350 can be set as practically required. In the embodiment, the height of the lower portion of the protruding structure 350 is, but not limited to, 3 to 20 nm. The width of the lower portion of the protruding structure 350 can be smaller than the width of the upper portion by, but not limited to, 2 to 10 nm.

In one of the embodiments, the word line 560 includes a gate dielectric layer 510, a first conducting layer 540, and a second conducting layer 550. The gate dielectric layer 510 can be on a sidewall and bottom of the word line trench 30, and may include a silicon oxide layer, a silicon nitride layer, or a high-k dielectric layer. A thickness of the gate dielectric layer 510 can be set as practically required. In the embodiment, the thickness of the gate dielectric layer 510 can be, but not limited to, 3 nm to 7 nm.

In one of the embodiments, the first conducting layer 540 is in the word line trench 30 and on a surface of the gate dielectric layer 510, and an upper surface of the first conducting layer 540 is lower than a top of the word line trench 30. The first conducting layer 540 may include, but not limited to, a titanium nitride layer. A thickness of the first conducting layer 540 can be set as practically required. In the embodiment, the thickness of the first conducting layer 540 can be, but not limited to, 2 nm to 5 nm.

In one of the embodiments, the second conducting layer 550 is in the word line trench 30 and on a surface of the first conducting layer 540, and an upper surface of the second conducting layer 550 is lower than the top of the word line trench 30. In the embodiment, a height of the upper surface of the second conducting layer 550 can be equal to a height of the upper surface of the first conducting layer 540. The second conducting layer 550 can be, but not limited to, a tungsten layer.

Figure 25:
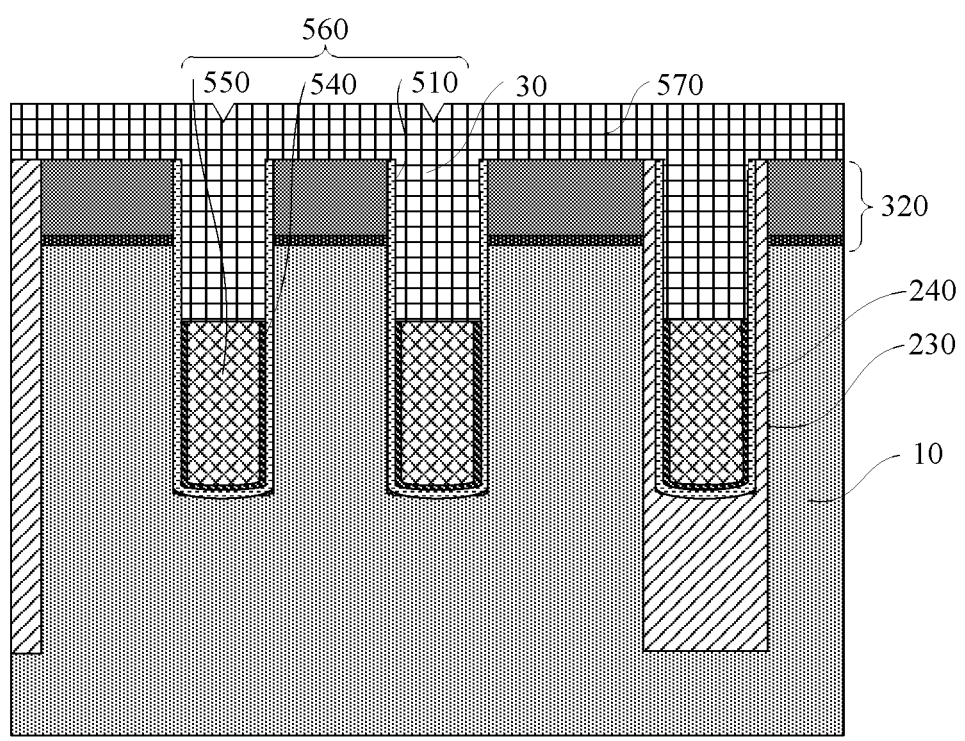
FIG. 25 is a sectional structure diagram of a structure obtained after a filler insulating layer is formed along direction AA in FIG. 7 in a substrate in a method for manufacturing a semiconductor structure according to an embodiment.
Figure 26:
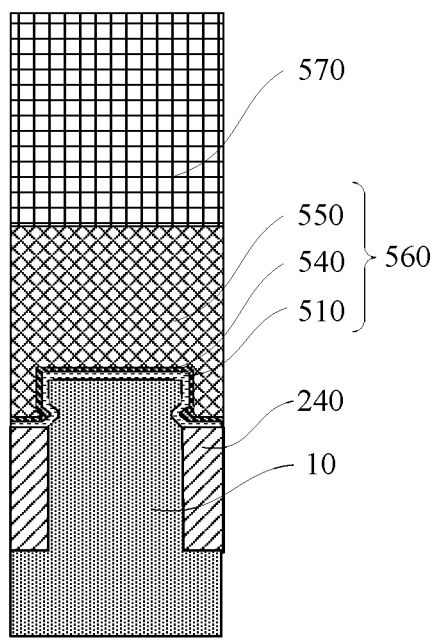
FIG. 26 is a sectional structure diagram of a structure obtained after a filler insulating layer is formed along direction CC in FIG. 7 in a substrate in a method for manufacturing a semiconductor structure according to an embodiment.

Referring to FIG. 25 to FIG. 26 together, in one of the embodiments, the semiconductor structure further includes a filler insulating layer 570. The filler insulating layer 570 is on the word line 560, and the filler insulating layer 570 fills the word line trench 30, and covers an upper layer of a patterned nitride layer 212. The filler insulating layer 570 may include, but not limited to, a silicon nitride layer.

In one of the embodiments, the semiconductor structure 100 further includes drains (not shown), the drain being in the AA 40 and between two word lines 560 across the same AA 40, and sources (not shown), located in the AAs 40 and on the sides of the word lines 560 distal from the drains.

Each technical feature of the abovementioned embodiments may be combined freely. For simplicity of description, not all possible combinations of each technical solution in the abovementioned embodiments are described. However, any combination of these technical features shall fall within the scope recorded in the specification without conflicting.

The abovementioned embodiments only express some implementation modes of the application and are specifically described in detail and not thus understood as limits to the patent scope of the application. It is to be pointed out that those of ordinary skill in the art may further make a plurality of transformations and improvements without departing from the concept of the application, and all of these fall within the scope of protection of the application. Therefore, the scope of patent protection of the application should be salient object to the appended claims.

What is claimed is:

1. A method of manufacturing a semiconductor structure, comprising:
   providing a substrate, and forming Shallow Trench Isolation (STI) structures in the substrate, the STI structures isolating a plurality of Active Areas (AAs) spaced in the substrate;
   forming a word line trench in the substrate, a depth of a portion of the word line trench in the AAs being smaller than a depth of a portion in the STI structures such that a first protruding structure is formed at a bottom of the portion of the word line trench in the AAs;
   forming an etch protection layer on a surface of the first protruding structure;
   partially removing the STI structures to form a second protruding structure based on the first protruding structure, an upper-portion sidewall and top of the second protruding structure being covered with the etch protection layer, and a lower portion of the second protruding structure being exposed from a removed portion of the STI structures;
   etching the lower portion of the second protruding structure to make a width of the lower portion of the second protruding structure smaller than a width of an upper portion of the second protruding structure, wherein a direction of the width of the lower portion of the protruding structure and a direction of the width of the upper portion of the protruding structure are parallel to an extension direction of the word line trench; and
   forming a word line structure in the word line trench.

2. The method of claim 1, wherein forming the etch protection layer on the surface of the first protruding structure comprises:
   injecting nitrogen into the word line trench at a preset temperature to form a nitride layer as the etch protection layer on a sidewall and bottom of the portion of the word line trench in the AAs.

3. The method of claim 1, wherein forming the STI structures in the substrate comprises:
   forming a first mask layer on an upper surface of the substrate;
   patterning the first mask layer to obtain a first patterned mask layer, a plurality of first opening patterns being formed in the first patterned mask layer, and the plurality of the first opening patterns defining positions of the STI structures;
   etching the substrate based on the first patterned mask layer to form a plurality of shallow trenches in the substrate; and
   filling the shallow trenches with an isolation material to form the STI structures.

4. The method of claim 3, wherein prior to forming the first mask layer on the upper surface of the substrate, the method further comprises: forming an oxide layer on the upper surface of the substrate, and then forming a nitride layer on an upper surface of the oxide layer.

5. The method of claim 4, wherein filling the shallow trenches with the isolation material to form the STI structures comprises:
   filling the isolation material in the shallow trenches and on an upper surface of the etched nitride layer; and
   removing the isolation material on the upper surface of the etched nitride layer, and filling the shallow trenches with the remaining isolation material, an upper surface of the remaining isolation material being flush with the upper surface of the patterned nitride layer.

6. The method of claim 5, wherein forming the word line structure in the word line trench comprises:
   forming a gate dielectric layer on the sidewall of the word line trench, the bottom of the word line trench, the upper surface of the etched nitride layer, and an upper surfaces of the STI structures;
   forming a first conducting material layer on a surface of the gate dielectric layer;
   forming a second conducting material layer on a surface of the first conducting material layer; and
   removing the first conducting material layer and second conducting material layer on the upper surface of the etched nitride layer and the upper surfaces of the STI structures, and performing etching-back to partially remove the first conducting material layer and second conducting material layer in the word line trench to obtain a first conducting layer and a second conducting layer, both an upper layer of the first conducting layer and an upper surface of the second conducting layer being lower than a top of the word line trench.

7. The method of claim 1, wherein forming the said word line trench in the said substrate comprises:
   forming a second mask layer on the upper surface of the substrate;
   patterning the second mask layer to obtain a second patterned mask layer, the second patterned mask layer having a second open pattern, and the second open pattern defining a position of the word line trench; and
   etching the substrate based on the second patterned mask layer to form the word line trench in the substrate.

8. The method of claim 1, wherein forming the word line structure in the word line trench comprises:
   forming the gate dielectric layer on the sidewall and bottom of the word line trench;
   forming the first conducting material layer on the surface of the gate dielectric layer;
   forming the second conducting material layer on the surface of the first conducting material layer; and
   etching back the first conducting material layer and the second conducting material layer to obtain the first conducting layer and the second conducting layer, both the upper surface of the first conducting layer and the upper surface of the second conducting layer being lower than the top of the word line trench.

9. The method of claim 8, wherein prior to the forming the gate dielectric layer, the method further comprises: removing the etch protection layer.

10. The method of claim 8, wherein after etching back the first conducting material layer and the second conducting material layer to obtain the first conducting layer and the second conducting layer, the method further comprises:
    forming a filler insulating layer in the word line trench and on the upper surface of the etched nitride layer.

11. The method of claim 8, further comprising:
    forming a drain and a source in a given one of the AAs, the drain being located between two adjacent word line structures across the given one of the AAs, and the source being located on the sides of the two adjacent word line structures distal from the drain.

12. The method of claim 11, before forming the drain and the source, further comprising: removing the etched nitride layer on the upper surface of the substrate, gate dielectric layer, first conducting material layer, and second conducting material layer.

13. The method of claim 1, wherein forming the etch protection layer on the surface of the first protruding structure comprises: forming an epitaxial layer on the sidewall and bottom of the portion of the word line trench in the AAs by an epitaxial growth, a material of the epitaxial layer being same with a material of the substrate.

14. A semiconductor structure, comprising:
    a substrate;
    Shallow Trench Isolation (STI) structures, the STI structures isolating a plurality of Active Areas (AAs) spaced in the substrate;
    a word line trench, located in the substrate;
    a word line structure, located in the word line trench; and
    a protruding structure, formed at a bottom portion of the word line trench in the AAs, and a width of a lower portion of the protruding structure being smaller than a width of an upper portion of the protruding structure, wherein a direction of the width of the lower portion of the protruding structure and a direction of the width of the upper portion of the protruding structure are parallel to an extension direction of the word line trench.

15. The semiconductor structure of claim 14, wherein a height of the lower portion of the protruding structure is 3 to 20 nm, and the width of the lower portion of the protruding structure is smaller than the width of the upper portion by 2 to 10 nm.

16. The semiconductor structure of claim 15, wherein a distance between the bottom portion of the word line trench in the AAs and an upper surface of the substrate is 90 to 160 nm, and a distance between a bottom portion of the word line trench in the STI structures and the upper surface of the substrate is 100 nm to 180 nm.

17. The semiconductor structure of claim 14, wherein the word line structure comprises a gate dielectric layer, a first conducting layer, and a second conducting layer;
    the gate dielectric layer comprises a silicon oxide layer, a silicon nitride layer, or a high-k dielectric layer.

18. The semiconductor structure of claim 14, further comprises:
    a filler insulating layer, located on a top of the word line structure, and the filler insulating layer fills the word line trench.

* * * * *